(12) United States Patent
Sechrist

(10) Patent No.: US 9,179,564 B2
(45) Date of Patent: Nov. 3, 2015

(54) CABLE RACK ASSEMBLY HAVING A TWO-DIMENSIONAL ARRAY OF CABLE CONNECTORS

(71) Applicant: Tyco Electronics Corporation, Berwyn, PA (US)

(72) Inventor: Joshua Tyler Sechrist, Etters, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 52 days.

(21) Appl. No.: 14/223,038

(22) Filed: Mar. 24, 2014

(65) Prior Publication Data

US 2015/0271938 A1 Sep. 24, 2015

(51) Int. Cl.
*H05K 5/00* (2006.01)
*H05K 5/02* (2006.01)

(52) U.S. Cl.
CPC .................................. *H05K 5/0247* (2013.01)

(58) Field of Classification Search
USPC ......... 361/726–732, 752, 756, 788, 796, 800;
439/181, 581, 736, 74, 497, 395, 578,
439/492, 77, 874
See application file for complete search history.

(56) References Cited

U.S. PATENT DOCUMENTS

| | | | |
|---|---|---|---|
| 5,961,350 A | 10/1999 | Shiu | |
| 6,351,719 B1 * | 2/2002 | Harenza et al. | 702/118 |
| 6,609,929 B2 | 8/2003 | Kamarauskas et al. | |
| 6,927,974 B2 * | 8/2005 | Robillard et al. | 361/679.4 |
| 7,042,737 B1 * | 5/2006 | Woolsey et al. | 361/799 |
| 7,457,128 B2 * | 11/2008 | Peterson | 361/728 |
| 7,907,419 B2 * | 3/2011 | Costello | 361/786 |
| 8,721,348 B2 * | 5/2014 | Costello | 439/64 |
| 8,804,342 B2 * | 8/2014 | Behziz et al. | 361/736 |

* cited by examiner

*Primary Examiner* — Hung S Bui

(57) ABSTRACT

Cable rack assembly including first and second stacks of cable connectors. The cable connectors of the first and second stacks have respective front ends that face in a common mating direction and respective back ends that are coupled to corresponding cables. The first and second stacks are adjacent to each other and form a two-dimensional array of the cable connectors. The cable rack assembly also includes a shared support panel that is positioned between the first and second stacks of the cable connectors. The shared support panel coincides with a panel plane that extends transverse to the two-dimensional array. The cable connectors of the first and second stacks directly engage the shared support panel therebetween.

20 Claims, 6 Drawing Sheets

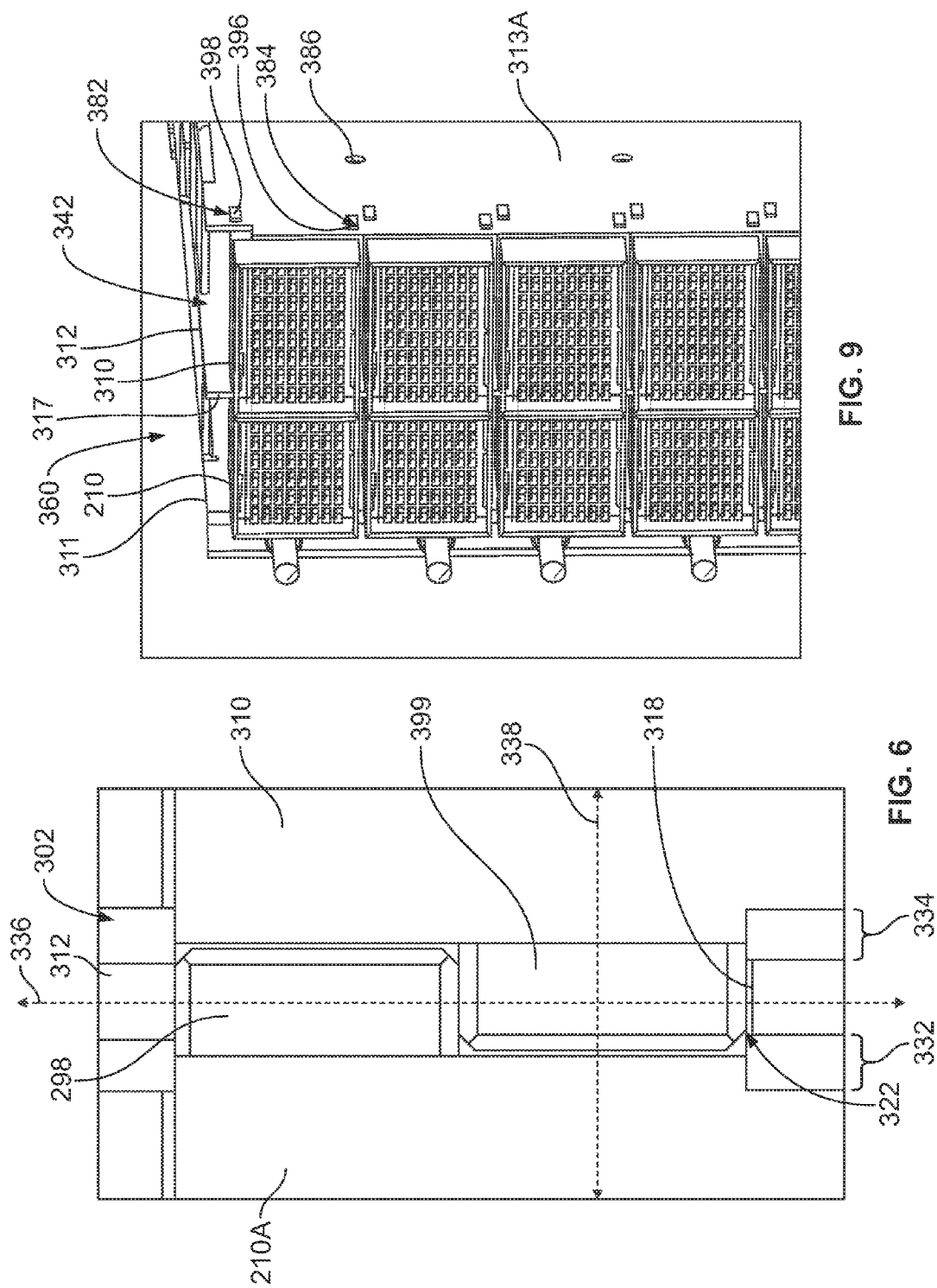

CABLE RACK ASSEMBLY HAVING A TWO-DIMENSIONAL ARRAY OF CABLE CONNECTORS

BACKGROUND OF THE INVENTION

The subject matter herein relates generally to a cable rack assembly that may be used with a communication system, such as a cable backplane system or a cable midplane system, in which the cable rack assembly has a two-dimensional array of cable connectors.

Various communication systems may include a two-dimensional array of electrical connectors for interconnecting different communication devices. For example, cable backplane or midplane systems, such as network systems, servers, data centers, and the like, utilize at least one two-dimensional array of cable connectors to interconnect daughter card assemblies. The daughter card assemblies may be referred to as line cards or switch cards. The cable connectors have front ends that engage corresponding mating connectors of the daughter card assemblies. The cable connectors also have back ends that are coupled to cables. The cables extend between the back ends of different cable connectors to communicatively couple the corresponding cable connectors. In a cable backplane system, the front ends of coupled cable connectors face in a common direction. In a cable midplane system, the coupled cable connectors can face in opposite directions. For example, a first two-dimensional array of the cable connectors may face in a first direction and a second two-dimensional array of the cable connectors may face in an opposite second direction. The cable connectors of the first two-dimensional array may be communicatively coupled to the cable connectors of the second two-dimensional array through the cables.

In a known cable backplane system, the two-dimensional array of cable connectors is formed by a plurality of brick assemblies that are stacked side-by-side. A brick assembly includes two parallel plates and a plurality of cable connectors positioned between the parallel plates. The cable connectors of each brick assembly are arranged side-by-side in a series. When the brick assemblies are stacked with respect to one another, the cable connectors form the two-dimensional array. More specifically, the cable connectors of each brick assembly may form one row or one column of the two-dimensional array.

There has been a general market demand to increase a density of electrical connectors in communication systems that include two-dimensional arrays. Increasing the density of the electrical connectors can reduce the overall size of the communication system and/or permit more electrical connectors to be used within a designated space. With respect to the cable backplane system described above, however, the two-dimensional array is assembled using a number of brick assemblies that each includes a pair of plates. Each plate separates adjacent cable connectors by a thickness of the plate, which consequently increases a distance (or pitch) between the adjacent cable connectors. Collectively, the plates may substantially increase a width or height of the communication system.

Accordingly, a need remains for a communication system having a two-dimensional array of cable connectors in which adjacent cable connectors are separated by a shorter distance than known systems.

BRIEF DESCRIPTION OF THE INVENTION

In an embodiment, a cable rack assembly is provided that includes first and second stacks of cable connectors. The cable connectors of the first and second stacks have respective front ends that face in a common mating direction and respective back ends that are coupled to corresponding cables. The first and second stacks are adjacent to each other and form a two-dimensional array of the cable connectors. The cable rack assembly also includes a shared support panel that is positioned between the first and second stacks of the cable connectors. The shared support panel coincides with a panel plane that extends transverse to the two-dimensional array. The cable connectors of the first and second stacks directly engage the shared support panel therebetween.

In an embodiment, a communication system is provided that includes a system chassis having a chassis cavity and a two-dimensional array of cable connectors disposed within the chassis cavity. The cable connectors of the two-dimensional array have respective front ends that face in a common mating direction and respective back ends that are coupled to corresponding cables. The two-dimensional array includes a plurality of stacks in which each of the stacks includes a series of the cable connectors arranged side-by-side. The communication system also includes a system frame holding the two-dimensional array of the cable connectors with respect to the system chassis. The system frame includes a shared support panel that coincides with a panel plane that extends transverse to the two-dimensional array. The shared support panel extends between two of the stacks and is directly engaged by the cable connectors of the two stacks.

BRIEF DESCRIPTION OF THE DRAWINGS

FIG. 6 is a cross-sectional view of the cable rack assembly showing lateral projections extending through a panel opening of a support panel.

FIG. 9 is a perspective view of a rack sub-assembly that may be used to construct the cable rack assembly of FIG. 2.

DETAILED DESCRIPTION OF THE INVENTION

Embodiments set forth herein may include communication systems or cable rack assemblies that may be used by the communication systems. The communication systems may be cable backplane systems or cable midplane systems. Various embodiments include cable connectors that are interconnected to other cable connectors through cables. As used herein, a cable midplane system has at least first and second two-dimensional arrays that each include cable connectors for engaging daughter card assemblies. The daughter card assemblies that mate with the first two-dimensional array may be communicatively coupled to the daughter card assemblies that mate with the second two-dimensional array. As used herein, a cable backplane system has only a single two-dimensional array of cable connectors or multiple two-dimensional arrays that face in a common direction. Although various elements, components, and features may be described with reference to a cable midplane system or to a cable backplane system, it should be understood that such elements, components, and features may also be applicable to other communication systems. Accordingly, embodiments are not limited to cable backplane or midplane systems.

The communication systems may be used in various applications. By way of example only, the communication systems may be used in telecom and computer applications, routers, servers, supercomputers, and uninterruptible power supply (UPS) systems. One or more of the cable connectors described herein may be similar to cable connectors of the STRADA Whisper or Z-PACK TinMan product lines available through TE Connectivity. For example, one or more of the cable connectors may be capable of transmitting data signals at high speeds, such as 10 gigabits per second (Gb/s), 20 Gb/s, 30 Gb/s, or more. In more particular embodiments, one or more of the cable connectors may be capable of transmitting data signals at 40 Gb/s, 50 Gb/s, or more. Each of the cable connectors may include a high-density contact array that includes signal contacts. A high-density contact array may have, for example, at least 12 signal contacts per 100 mm$^2$ along a front end of the cable connector. In more particular embodiments, the high-density contact array may have at least 20 signal contacts per 100 mm$^2$ along the front end of the cable connector.

Figure 1:
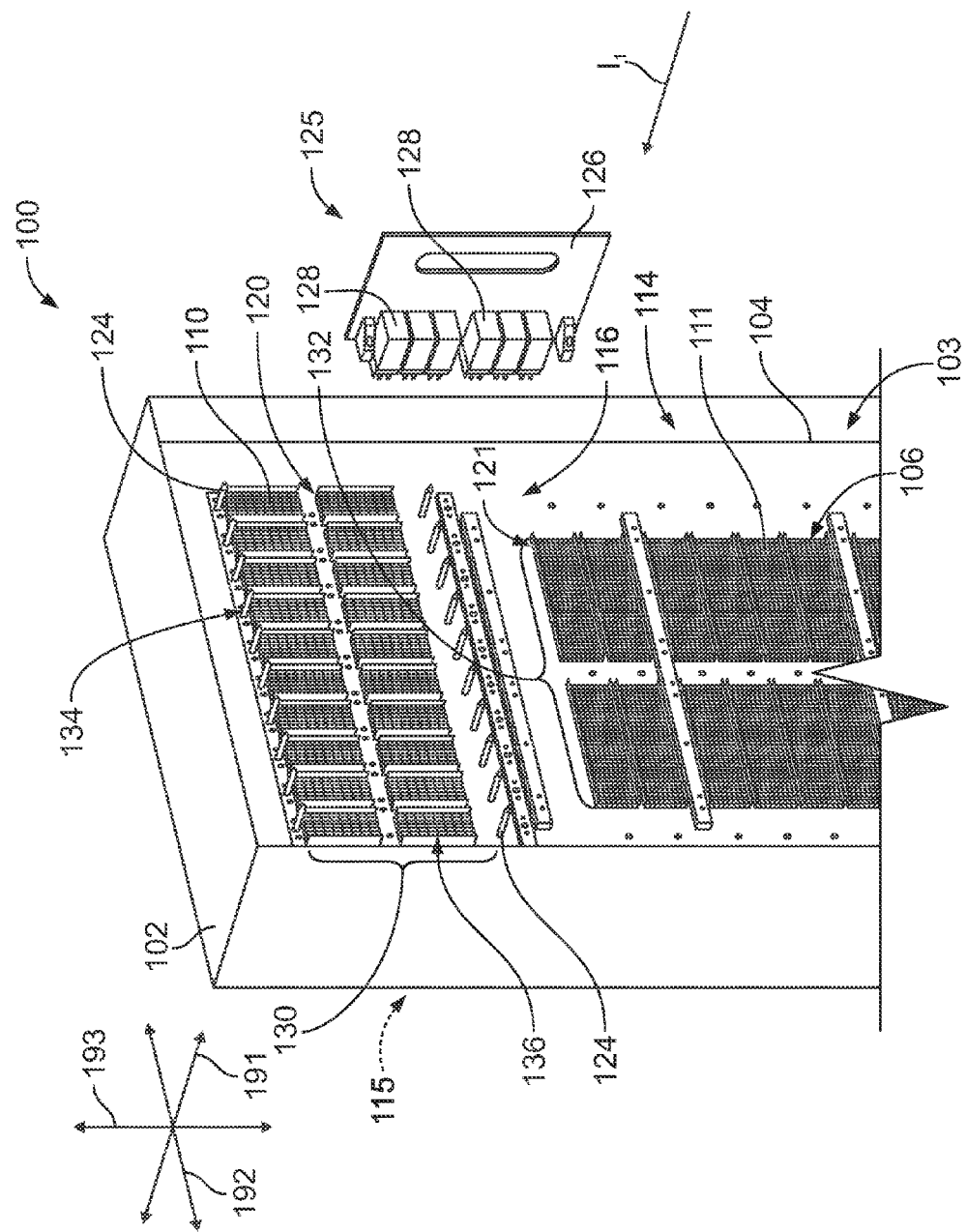
FIG. 1 is a front perspective view of a communication system formed in accordance with an embodiment.

FIG. 1 is a front perspective view of a portion of a communication system 100 formed in accordance with an embodiment. In an exemplary embodiment, the communication system 100 is a cable backplane system. In other embodiments, however, the communication system 100 may be a cable midplane system. For reference, the communication system 100 is oriented with respect to mutually perpendicular axes, including a mating axis 191, a first lateral axis 192, and a second lateral axis 193. In an exemplary embodiment, the second lateral axis 193 extends parallel to the force of gravity. However, embodiments set forth herein may have other orientations. For example, the first lateral axis 192 may extend parallel to the force of gravity. Accordingly, it should be understood that the terms "mating axis," "first lateral axis," and "second lateral axis" are used only to distinguish different axes and are not intended to require a particular orientation with respect to gravity.

The communication system 100 may include a system chassis 102, one or more backplanes 104 coupled to and supported by the system chassis 102, and a cable rack assembly 106. The system chassis 102 includes a chassis cavity 103 where the backplane 104 and the cable rack assembly 106 are disposed. The cable rack assembly 106 includes cable connectors 110, 111. In the illustrated embodiment, the backplane 104 includes windows 120, 121 that receive the cable connectors 110, 111, respectively. The backplane 104 may be used to position and support the cable rack assembly 106. In other embodiments, such as those described with reference to FIGS. 2-9, the communication system 100 may not utilize a backplane 104. For example, the cable rack assembly 106 may be directly coupled to and entirely supported by the system chassis 102.

The cable rack assembly 106 includes a two-dimensional array 130 of the cable connectors 110 and a two-dimensional array 132 of the cable connectors 111. As used herein, a two-dimensional array of cable connectors includes a plurality of cable connectors along a first lateral axis and a plurality of cable connectors along a second lateral axis. For example, the two-dimensional array 130 includes a plurality of the cable connectors 110 positioned along the first lateral axis 192 and a plurality of the cable connectors 110 positioned along the second lateral axis 193. As shown in FIG. 1, the two-dimensional array 132 includes ten stacks or columns 134 of the cable connectors 110 in which each stack 134 includes two of the cable connectors 110. The two-dimensional array 132 may also be described as having two stacks or rows 136 of the cable connectors 110 in which each stack 136 includes ten of the cable connectors 110. As used herein, a stack of cable connectors may be at least two cable connectors that are positioned proximate to one another. In some embodiments, a stack of cable connectors includes at least three cable connectors or, more particularly, at least five cable connectors.

Figure 3:
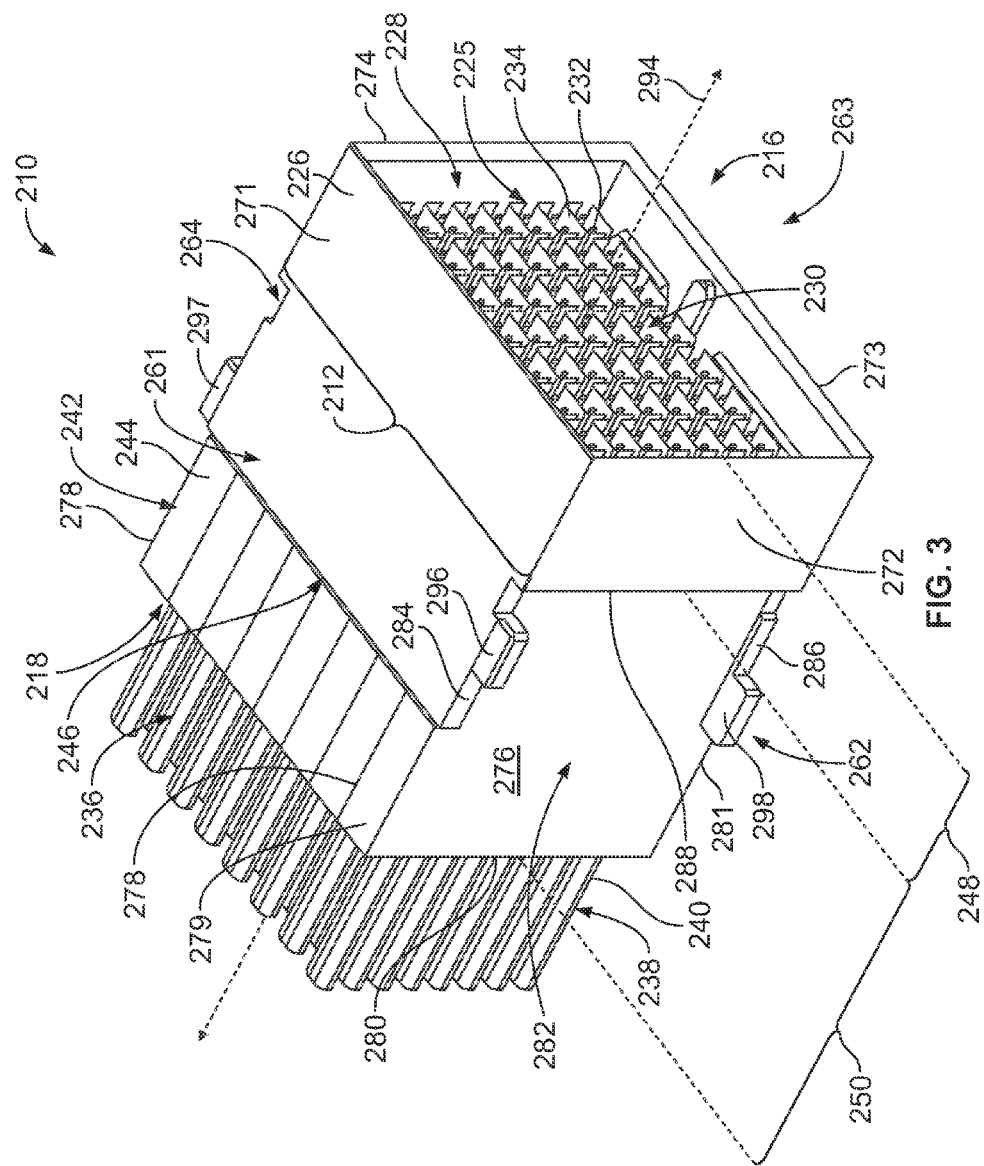
FIG. 3 is an isolated perspective view of a cable connector that may be used with the cable rack assembly of FIG. 2.

The cable connectors 110, 111 may be cable connectors that are interconnected to one another through cables (not shown), such as the cables 238 (shown in FIG. 3). In such embodiments, the cable connectors 110, 111 and the cables eliminate interconnections via traces of a circuit board, such as those that may be used in more conventional backplane communication systems. The cable connectors 110, 111 and the cables may have improved signal performance along the signal paths between various connectors of the communication system 100 as compared to conventional backplane communication systems.

The backplane 104 may be a circuit board and may be manufactured from circuit board material known in the art, such as FR-4 material. In other embodiments, the backplane 104 may be formed from another suitable structure, such as sheet metal. The backplane 104 is configured to be disposed within the chassis cavity 103. The chassis cavity 103 is accessible through a front or first opening 114 of the communication system 100 and an opposite back or second opening 115. During assembly of the communication system 100, the backplane 104 and/or the cable rack assembly 106 may be loaded into the chassis cavity 103 through the front opening 114 or through the back opening 115. In addition to the cable rack assembly 106, the system chassis 102 may support other components (not shown) of the communication system 100, such as power supplies, cooling fans, and the like.

The backplane 104 has a first or front side 116 and an opposite second or back side (not shown) and includes the windows 120, 121 that extend through the backplane 104. When the cable rack assembly 106 interfaces with the backplane 104 along the second side, the windows 120, 121 permit the cable connectors 110, 111, respectively, to extend through the windows 120, 121 to be presented along the first side 116 for engaging one or more daughter card assemblies 125. To this end, the cable rack assembly 106 may include a plurality of guide pins 124 that are configured to engage and align the backplane 104 relative to the cable rack assembly 106. The guide pins 124 may also engage the daughter card assemblies 125 when the daughter card assemblies 125 are mated with the cable connectors 110.

Depending on the configuration and purpose of the daughter card assemblies 125, the daughter card assemblies 125 may be referred to as line cards or switch cards. As shown in FIG. 1, the daughter card assembly 125 includes a circuit board 126 (or daughter card) and card connectors 128 positioned along a leading edge of the circuit board 126. In certain embodiments, the cable connectors 110, 111, and the card connectors 128 are high-speed differential connectors, such as the STRADA Whisper or Z-PACK TinMan cable connectors available through TE Connectivity.

The daughter card assemblies 125 are configured to be advanced toward the communication system 100 in an insert direction I₁ along the mating axis 191. The backplane 104 is coupled to the system chassis 102 and held in a position such that the backplane 104 coincides with a plane defined by the first and second lateral axes 192, 193. The two-dimensional arrays 130 and 132 may extend parallel to or coincide with the plane defined by the first and second lateral axes 192, 193.

Figure 2:
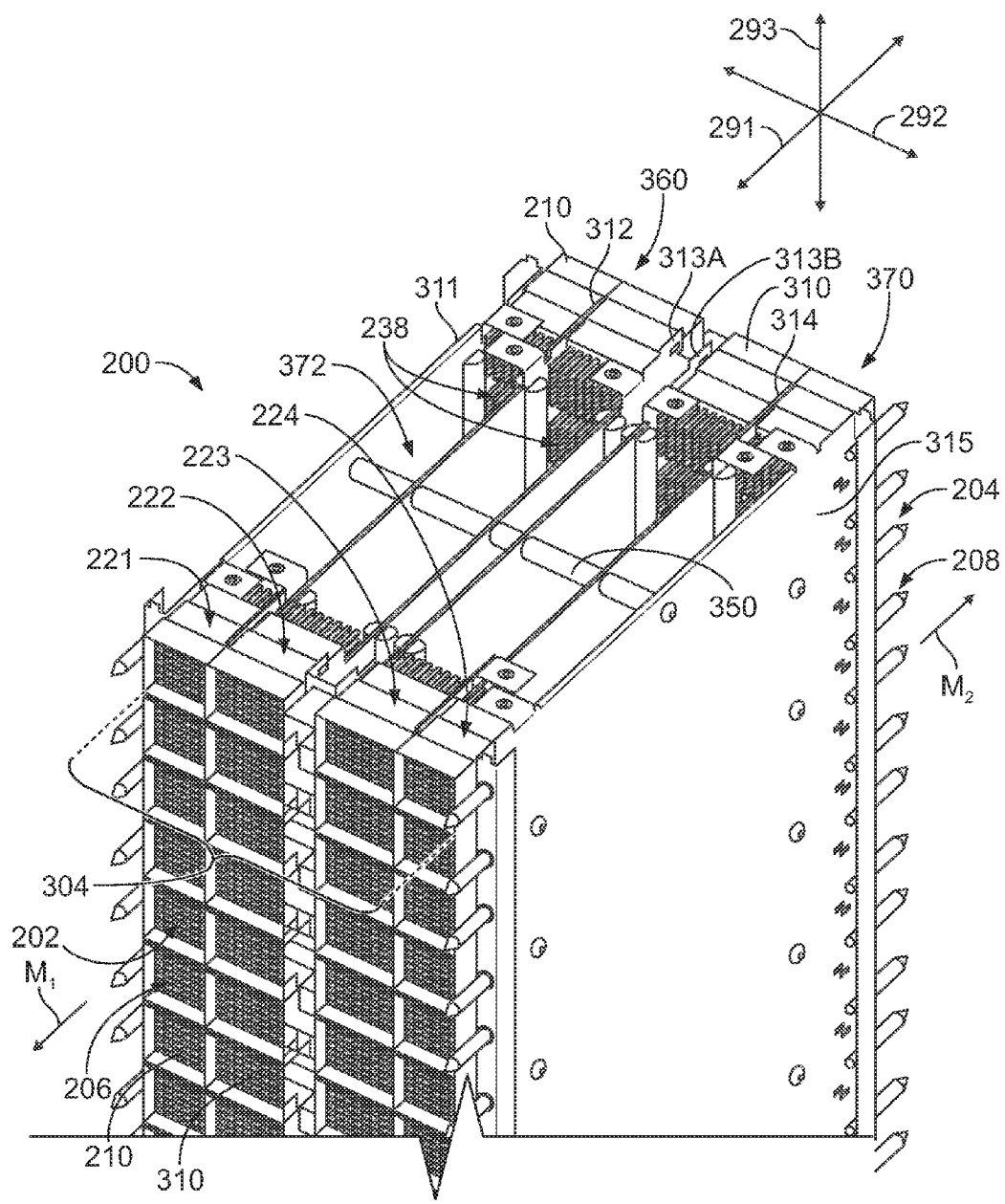
FIG. 2 is a perspective view of a cable rack assembly that may be formed in accordance with an embodiment.

FIG. 2 is a perspective view of a cable rack assembly 200. The cable rack assembly 200 is oriented with respect to mutually perpendicular axes 291, 292, 293, which include a mating axis 291, a first lateral axis 292, and a second lateral axis 293. The cable rack assembly 200 may be used with a communication system (not shown), such as the communication system 100 (FIG. 1). In certain embodiments, the cable rack assembly 200 may be used with a cable midplane system. The cable rack assembly 200 includes first and second mating interfaces 202, 204 that face in respective opposite directions along the mating axis 291. The mating interfaces 202, 204 include two-dimensional arrays 206, 208, respectively, of cable connectors 210, 310. The cable connectors 210, 310 are presented to an exterior of the cable rack assembly 200. The cable connectors 210, 310 are interconnected to one another through cables 238. The cables 238 are configured to extend entirely between and interconnect the corresponding cable connectors 210, 310, but only portions of the cables 238 are shown for illustrative purposes. In an exemplary embodiment, the cable connectors 210, 310 of the mating interface 202 are interconnected to cable connectors 210, 310 of the mating interface 204. In other embodiments, one or more of the cable connectors 210, 310 may be interconnected to one more of the cable connectors 210, 310 of the same mating interface.

As shown in FIG. 2, the two-dimensional array 206 includes a plurality of stacks 221, 222, 223, 224 along the mating interface 202 in which each stack 221-224 includes a plurality or series of the cable connectors. More specifically, each of the stacks 221, 224 includes a series of the cable connectors 210 arranged side-by-side along the second lateral axis 293. Each of the stacks 222, 223 includes a series of the cable connectors 310 arranged side-by-side along the second lateral axis 293. As such, each of the stacks 221-224 may constitute an individual column of cable connectors of the two-dimensional array 206. The two-dimensional array 208 may include stacks similar to the stacks 221-224.

The cable rack assembly 200 includes a support frame 304 that holds the two-dimensional arrays 206, 208. The support frame 304 is configured to be held by a system chassis (not shown) and may include a number of interconnected support panels. For example, in the illustrated embodiment, the support frame 304 includes support panels 311, 312, 313A, 313B, 314, 315. The support panels 311-315 may be stamped and formed from sheet metal to include the features described herein. Adjacent support panels define a corresponding cable cavity therebetween. For example, the support panels 311, 312 define a cable cavity 372 therebetween. The cables 238 are configured to extend through the cable cavity 372 and interconnect the corresponding cable connectors 210.

Each of the support panels 311-315 extends transverse to the two-dimensional arrays 206, 208. More specifically, the cable connectors 210, 310 of the two-dimensional array 206 are generally co-planar such that the two-dimensional array 206 extends parallel to a plane that is defined by the first lateral axis 292 and the second lateral axis 293. Likewise, the cable connectors 210, 310 of the two-dimensional array 208 are generally co-planar such that the two-dimensional array 208 extends parallel to the plane that is defined by the first lateral axis 292 and the second lateral axis 293. Each of the support panels 311-315 extends along a plane that is parallel to the second lateral axis 293 and the mating axis 291. Accordingly, the support panels 311-315 extend transverse to the two-dimensional arrays 206, 208. Because the two-dimensional arrays 206, 208 extend between the support panels 311, 315, the support panels 311, 315 are hereinafter referred to as the outer support panels 311, 315. The support panels 312, 314 are hereinafter referred to as shared support panels as each of the shared support panels 312, 314 is positioned between and directly engages two of the stacks. The support panels 313A, 313B are hereinafter referred to as inner support panels. The inner support panels 313A, 313B are spaced apart from each other when the cable rack assembly 200 is fully assembled. The cable rack assembly 200 may be assembled from rack sub-assemblies 360, 370, which are described in greater detail below with respect to FIGS. 7-9. The support frame 304 is also described in greater detail below with respect to FIGS. 7-9.

FIG. 3 is an isolated perspective view of the cable connector 210. Although the following is described with reference to the cable connector 210, the cable connector 310 (FIG. 2) may have similar features. The cable connector 210 includes a front end 216 and a back end 218 that face in respective opposite directions along a central axis 294 that extends through the cable connector 210. When the cable connector 210 is positioned within the cable rack assembly 200 (FIG. 2), the central axis 294 extends parallel to the mating axis 291 (FIG. 2). The cable connector 210 includes a connector housing or shroud 226 having a mating cavity 228 that opens to the front end 216. The cable connector 210 also includes a contact array 230 of electrical contacts that are disposed within the mating cavity 228. The electrical contacts include signal contacts 232 and ground contacts 234. The contact array 230 may be a high-density contact array.

The signal and grounds contacts 232, 234 may form contact sub-assemblies 225 of the cable connector 210. In the illustrated embodiment, each of the contact sub-assemblies 225 includes a pair of the signal contacts 232 and a corresponding ground contact 234 that surrounds the pair of the signal contacts 232. The ground contact 234 of each contact sub-assembly 225 partially surrounds the corresponding signal contacts 232 along a length of the signal contacts 232 to ensure that the signal paths are electrically shielded from interference. The ground contacts 234 are C-shaped in the illustrated embodiment, but may be shaped differently in other embodiments.

As described above, the cable connector 210 is configured to be interconnected to other cable connectors 210 through a bundle 236 of corresponding cables 238. The cables 238 are coupled to the back end 218. In an exemplary embodiment, the cables 238 are twin axial cables having two signal wires (not shown) within a common jacket 240 of the cable 238. Each pair of signals contacts 232 may be terminated to the two signal wires of a corresponding cable 238. In some embodiments, the signal wires convey differential signals to the pairs of signal contacts 232. In an exemplary embodiment, the signal wires are shielded, such as with a cable braid (not shown) of the cable 238. Optionally, each of the signal wires may be individually shielded. Other types of cables 238 may be provided in alternative embodiments. For example, the cable 238 may be a coaxial cable carrying a single signal conductor.

The cable connectors 210 are configured to mate with corresponding card connectors (not shown), such as the card connectors 128 (FIG. 1). In an exemplary embodiment, the cable connectors 210 are high speed differential pair cable connectors that include a plurality of differential pairs of conductors. The differential pairs of conductors are shielded along the signal paths thereof to reduce noise, crosstalk, and other interference along the signal paths of the differential pairs.

In some embodiments, the cable connectors 210 include a plurality of contact modules 242 that are held by the connector housing 226. Each of the contact modules 242 includes a series of the contact sub-assemblies 225 and a module body 244 that holds the series of the contact sub-assemblies 225. The module body 244 provides support for the contact sub-assemblies 225 and may include opposite side surfaces 276, 278 and body edges 279, 280, 281 that extend between the side surfaces 276, 278. In the illustrated embodiment, the cables 238 extend into the module body 244 such that the module body 244 supports a portion of the cables 238. The module body 244 may provide strain relief for the cables 238. Optionally, the module body 244 may be manufactured from a plastic material. Alternatively, the module body 244 may be manufactured from a metal material.

The connector housing 226 includes the front end 216 of the cable connector 210 and also a loading end or side 246. The mating cavity 228 extends between the front end 216 and the loading end 246. As shown, the contact modules 242 may be loaded into the connector housing 226 through the loading end 246. The connector housing 226 holds the contact modules 242 side-by-side in a stacked arrangement such that the contact sub-assemblies 225 are positioned in parallel columns. In the illustrated embodiment, there are eight contact modules 242, but any number of the contact modules 242 may be held by the connector housing 226 depending on the particular application.

As shown in FIG. 3, the cable connectors 210 have connector sides 261, 262, 263, 264. Each of the connector sides 261-264 extends between the front end 216 and the back end 218 along the central axis 294. In the illustrated embodiment, each of the connector sides 261-264 is defined by a portion of the connector housing 226 and one or more portions of the contact modules 242. For example, the connector housing 226 includes housing sides 271, 272, 273, 274. The connector sides 261-264 include the housing sides 271-274, respectively, and corresponding portions of the contact modules 242. More specifically, the connector side 262 includes the housing side 272 and the corresponding side surface 276 of the corresponding module body 244. The connector side 264 includes the housing side 274 and corresponding side surface 278 of the corresponding module body 244. The connector side 261 includes the housing side 271 and the body edges 279 of the module bodies 244. The connector side 263 includes the housing side 273 and the body edges 281 of the module bodies 244.

In an exemplary embodiment, each of the cable connectors 210 interfaces with at least two of the support panels 311-315 (FIG. 2) and at least two other cable connectors 210. As used herein, the term "interfaces with" and the like includes a surface of a first component (i) directly engaging a surface of an adjacent second component or (ii) directly facing the surface of the adjacent second component with a nominal gap therebetween.

Each of the connector sides 262, 264 may interface with a connector side of an adjacent cable connector and one of the support panels 311-315 (FIG. 2). To this end, the connector side 262 includes a platform portion or section 248 that interfaces with an adjacent cable connector 210, and a recessed portion 250 that interfaces with one of the support panels 311-315. The platform portion 248 is proximate to the front end 216, and the recessed portion 250 is proximate to the back end 218. The platform portion 248 is configured to abut another platform portion of another cable connector. The recessed portion 250 may represent a portion of the cable connector 210 having a reduced width 212 relative to the width 212 of the platform portion 248. In the illustrated embodiment, the platform portion 248 of the connector side 262 includes the housing side 272. The housing side 272 is substantially planar or flat. The recessed portion 250 has a panel-receiving recess 282 that is defined by the side surface 276 of one of the contact modules 242, side edges 284, 286 of the housing sides 271, 273, respectively, and a rear edge 288 of the housing side 272. The rear edge 288 faces toward the back end 218 in a direction along the central axis 294. When the cable rack assembly 200 (FIG. 2) is fully constructed, the rear edges 288 of the cable connectors 210 may at least partially cover a front edge 317 (FIG. 5) of the shared support panel 312 (FIG. 2).

The connector side 262 also includes lateral projections 296, 298. In the illustrated embodiment, the connector side 262 includes two lateral projections, but alternative embodiments may include only one lateral projection or more than two lateral projections. The lateral projections 296, 298 are located at different distances relative to the front end 216 or the back end 218. For example, the lateral projection 296 is located closer to the front end 216 than the lateral projection 298, and the lateral projection 298 is located closer to the back end 218 than the lateral projection 296.

The connector side 264 is similar to the connector side 262. For instance, the connector side 264 may have lateral projections 297, 299 (shown in FIG. 4). In some embodiments, the cable connector 210 may have a rotational symmetry such that the lateral projections 296, 298 exchange spatial positions with the lateral projections 299, 297, respectively, when the cable connector 210 is rotated about the central axis 294 by 180°. More specifically, the lateral projections 296, 298 in FIG. 3 may have the same spatial positions as the lateral projections 299, 297, respectively, after the cable connector 210 is rotated by 180°. Moreover, for embodiments in which the lateral projections 296, 298 are located at different distances with respect to the front end 216 and the lateral projections 297, 299 are located at different distances with respect to the front end 216, the lateral projections 296-299 may not interfere with one another when the cable connectors 210 are positioned side-by-side in either of the rotational orientations.

Figure 4:
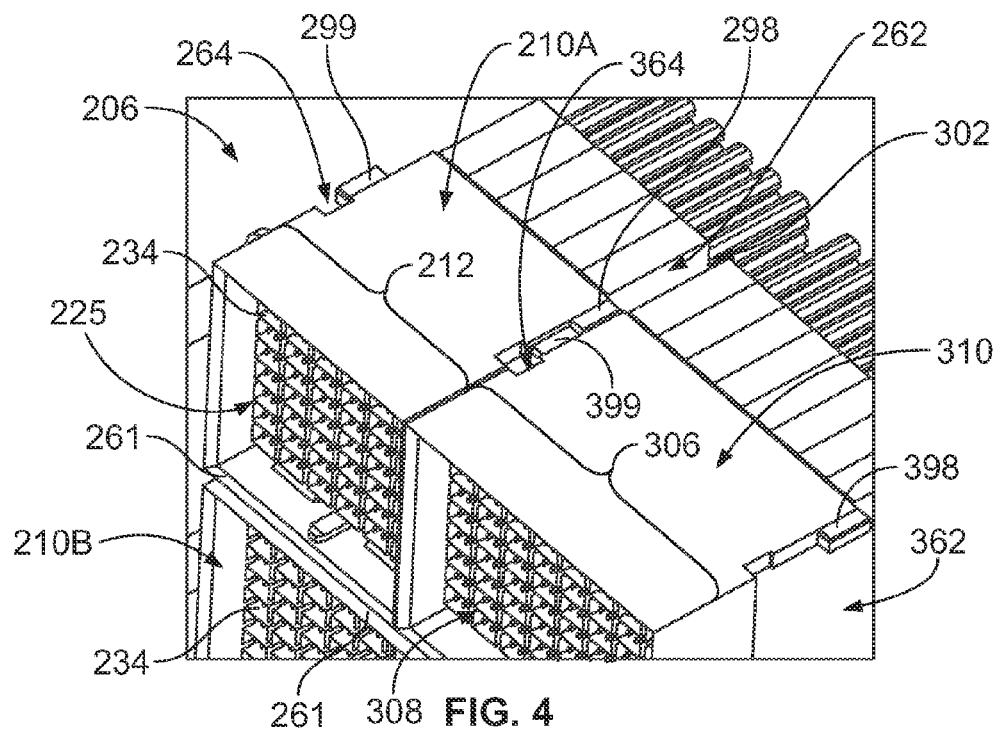
FIG. 4 illustrates a portion of a two-dimensional array of the cable connectors, which may be used with the cable rack assembly of FIG. 2.

FIG. 4 is an isolated view of a portion of the two-dimensional array 206. The portion of the two-dimensional array 206 shown in FIG. 4 includes cable connectors 210A, 210B, and the cable connector 310. The cable connectors 210A, 210B are identical to the cable connector 210 (FIG. 2). In the illustrated embodiment, the cable connector 310 has at least some features that are identical to features of the cable connector 210. For example, the cable connector 310 has connector sides 362, 364 that are identical to the connector sides 262, 264, respectively, and include lateral projections 398, 399 that are identical to the lateral projections 298, 299, respectively. The connector side 362 may include an additional lateral projection 396 (shown in FIG. 9) that is identical to the lateral projection 296 (FIG. 3), and the connector side 364 may include an additional lateral projection (not shown) that is identical to the lateral projection 297 (FIG. 3). The cable connector 310, however, may have different features. For instance, the cable connector 310 includes a greater number of contact sub-assemblies 308 than a number of the contact sub-assemblies 225 of the cable connector 210A. The cable connector 310 has a width 306 that is greater than the width 212 of the cable connector 210A.

The cable connectors 210A, 210B have respective different rotational orientations in FIG. 4. The cable connector 210A has been rotated 180° about the central axis 294 (FIG. 3) with respect to the cable connector 210B. Accordingly, the C-shaped ground contacts 234 of the cable connectors 210A, 210B open in respective opposite directions. The cable connector 310 may have a similar orientation as the cable connector 210A. When the cable connectors 210A, 210B are positioned side-by-side as shown in FIG. 4, the connector side 261 of the cable connector 210A and the connector side 261 of the cable connector 210B interface with each other. More specifically, the connector sides 261 directly engage each other. When the cable connectors 210A, 310 are positioned side-by-side as shown in FIG. 4, the connector side 262 of the cable connector 210A and the connector side 364 of the cable connector 310 interface with each other and form a panel-receiving slot 302 therebetween. The panel-receiving slot 302 is configured to receive the support panel 312 (FIG. 2) as described in greater detail below.

Figure 5:
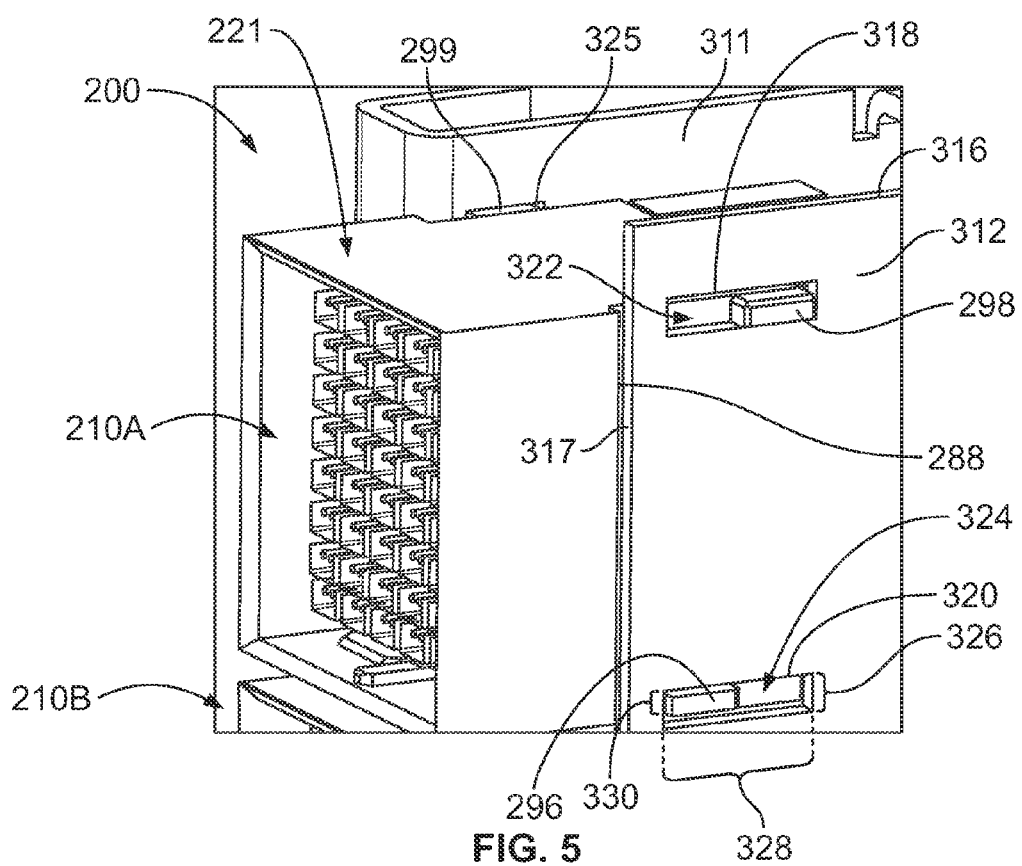
FIG. 5 is an enlarged perspective view of a portion of the cable rack assembly of FIG. 2.

FIG. 5 is an enlarged perspective view of a portion of the cable rack assembly 200 positioned between the outer support panel 311 and the shared support panel 312. As described above, the outer and shared support panels 311, 312 form part of the system frame 304 (FIG. 2). The shared support panel 312 is configured to be positioned between the stack 221 and the stack 222 (FIG. 2). As shown in FIG. 5, the shared support panel 312 has an outer edge 316 and a front edge 317 that joins the outer edge 316. The outer edge 316 faces in a direction along the second lateral axis 293 (FIG. 2). The front edge 317 faces in a direction along the mating axis 291 (FIG. 1) and is configured to interface with the rear edges 288 of the cable connectors 210A, 210B of the stack 221. For example, the front edge 317 may directly engage the rear edges 288 or may directly face the rear edges 288 with a nominal gap therebetween.

The shared support panel 312 also includes inner edges 318, 320 that define panel openings 322, 324, respectively. Each of the panel openings 322, 324 has a height 326 and a length 328. The lateral projections 296, 298 are sized and shaped relative to the panel openings 324, 322, respectively, to be positioned therein. During operation of the cable rack assembly 200, the inner edges 318, 320 may engage the lateral projections 298, 296, respectively, to restrain movement of the cable connector 210A along the shared support panel 312. More specifically, the inner edges 318, 320 may restrain movement of the cable connector 210A along the second lateral axis 293 or the mating axis 291. However, the inner edges 318, 320 may permit at least some movement along the second lateral axis 293 or the mating axis 291 such that the cable connectors 210 are permitted to float. For example, the height 326 of the panel openings 322, 324 may be greater than a height 330 of the lateral projections 296, 298. As such, the cable connector 210A may be permitted to float along the second lateral axis 293. Also shown, the outer support panel 311 may include a panel opening 325 that receives the lateral projection 299. The outer support panel 311 may also include another panel opening 325 for receiving the lateral projection 297 (FIG. 3).

FIG. 6 is a cross-sectional view showing the shared support panel 312 within the panel-receiving slot 302 and the lateral projections 298, 399 disposed within the panel opening 322. The lateral projections 298, 399 may engage each other and the inner edge 318 that defines the panel opening 322. Accordingly, the lateral projections 298, 399 may share a common panel opening. In some embodiments, the lateral projections 298, 399 and the panel opening 322 may be dimensioned relative to one another such that the lateral projections 298, 399 form a snug fit within the panel opening 322. In such embodiments, the lateral projections 298, 399 may be characterized as nesting within the common panel opening 322. In other embodiments, the lateral projections 298, 399 may be spaced apart and positioned within separate panel openings.

Also shown in FIG. 6, when the cable connectors 210A, 310 are operably positioned with respect to the shared support panel 312, a float gap 332 may exist between the support panel 312 and the cable connector 210A, and a float gap 334 may exist between the support panel 312 and the cable connector 310. The float gaps 332, 334 permit the cable connectors 210A, 310 to float bi-directionally along the first lateral axis 292 (FIG. 2). As described above, the cable connectors 210A, 310 may also be permitted to float along the second lateral axis 293 (FIG. 2). Accordingly, the cable connectors 210A, 310 are capable of moving along the first lateral axis 292 or the second lateral axis 293 (FIG. 2) while mating with corresponding mating connectors, such as the card connectors 128 (FIG. 1).

Also shown in FIG. 6, the shared support panel 312 coincides with a panel plane 336. The panel plane 336 extends transverse to the two-dimensional arrays 206, 208 (FIG. 2). More specifically, the two-dimensional array 206 may coincide with an array plane 338 that extends parallel to the first and second lateral axes 292, 293 (FIG. 2). As shown, the panel plane 336 and the array plane 338 extend transverse or orthogonal to each other. The two-dimensional array 208 may also coincide with an array plane (not shown) that extends transverse or orthogonal to the panel plane 336.

Figure 8:
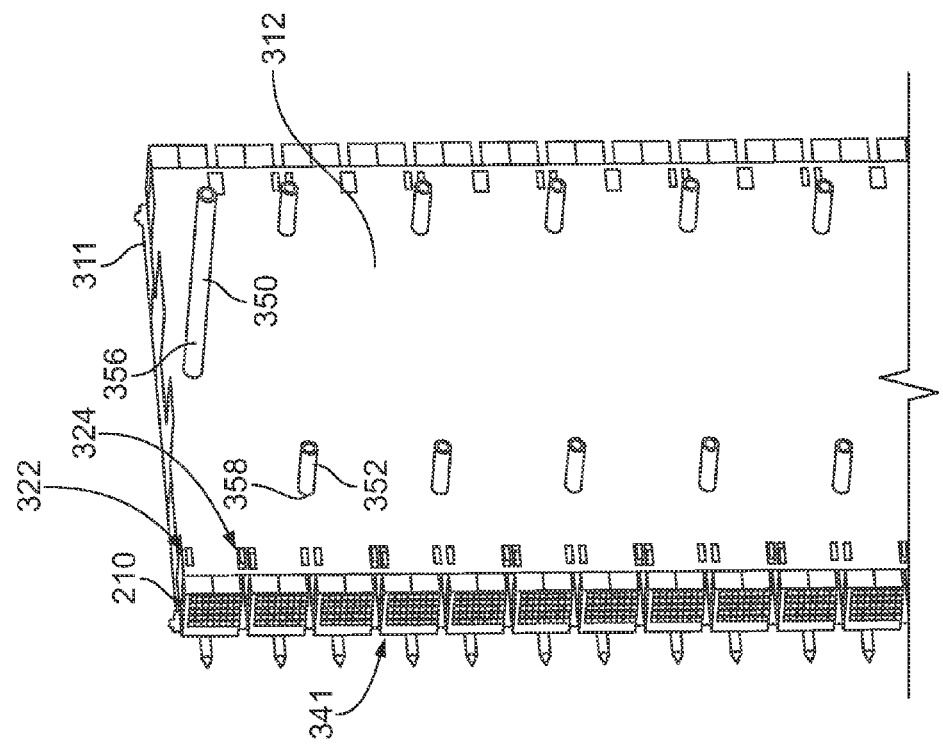
FIG. 8 is another perspective view of the incomplete cable rack assembly illustrating a subsequent stage during the construction of the cable rack assembly of FIG. 2.
Figure 7:
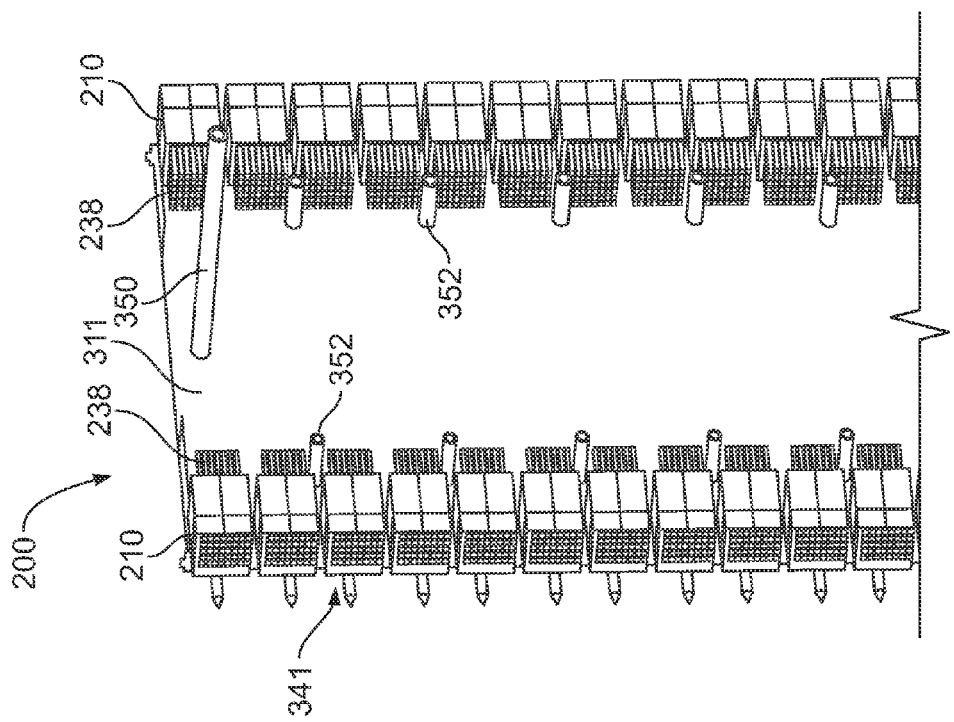
FIG. 7 is a perspective view of an incomplete cable rack assembly illustrating one stage during the construction of the cable rack assembly of FIG. 2.

FIGS. 7-9 illustrate different stages of assembling the cable rack assembly 200. FIG. 7 is a perspective view of the outer support panel 311 and a first connector layer 341. The first connector layer 341 includes the cable connectors 210 that will be part of the two-dimensional arrays 206, 208 (FIG. 2) along the mating interfaces 202, 204 (FIG. 2). The cable connectors 210 are interconnected through the cables 238 that are configured to extend between the mating interfaces 202, 204. For illustrative purposes, however, only portions of the cables 238 are shown.

To assemble the cable rack assembly 200, the cables connectors 210 of the first connector layer 341 are positioned with respect to the support panel 311. More specifically, the lateral projections 296-298 (FIG. 3) and 299 (FIG. 4) of the cable connectors 210 may be inserted into corresponding panel openings 325 (FIG. 5) of the outer support panel 311. Depending on the rotational orientation of the cable connector 210, the lateral projections 297, 299 may be inserted into the panel openings 325 or the lateral projections 296, 298 may be inserted into the panel openings 325. Prior to positioning the cable connectors 210 of the first connector layer 341, the outer support panel 311 may be positioned horizontally such that gravity pulls the cable connectors 210 toward the outer support panel 311.

Before, during, or after the assembly of the first connector layer 341, elongated coupling posts or rods 350, 352 may be coupled to the outer support panel 311. The coupling posts 350 and 352 have different lengths. The coupling post 350 is configured to extend through the support panels 312-314 (FIG. 2) and engage the support panel 315 (FIG. 2). The coupling posts 352, on the other hand, are configured to extend through the shared support panel 312 and couple to the inner support panel 313A (FIG. 2).

FIG. 8 is a perspective view of the shared support panel 312 positioned over the first connector layer 341 and the outer support panel 311. The shared support panel 312 includes post openings 356, 358 that receive the coupling posts 350, 352, respectively. Depending on the orientation of the cable connectors 210, the lateral projections 298, 296 (FIG. 3) or the lateral projections 297 (FIG. 3), 299 (FIG. 4) may be received by the respective panel openings 322, 324 of the shared support panel 312. After the shared support panel 312 is positioned over the first connector layer 341, a second connector layer 342 (shown in FIG. 9) may be positioned with respect to the shared support panel 312.

FIG. 9 is an enlarged perspective view of a rack sub-assembly 360. The rack sub-assembly 360 may be constructed after the inner support panel 313A has been positioned over the second connector layer 342. The second connector layer 342 includes the cable connectors 310. As shown, the inner support panel 313A includes panel openings 382, 384 that are configured to receive the lateral projections 398, 396, respectively, of the cable connectors 310. In the illustrated embodiment, the panel openings 382, 384 only receive the lateral projections 398, 396, respectively, from one cable connector 310 and are not configured to receive lateral projections from another cable connector of a third connector layer (not shown). In other embodiments, the inner support panel 313A may be similar to the shared support panel 312 and receive a pair of lateral projections within each of the panel openings 382, 384. In the illustrated embodiment, the inner support panel 313A includes post openings 386 that align with and receive the coupling posts 352 (FIG. 7). The post openings 386 and the coupling posts 352 are configured to receive hardware, such as screws, for securing the inner support panel 313A to the coupling post 352 and, consequently, to the outer support panel 311. Also shown in FIG. 9, the front edge 317 of the shared support panel 312 is covered by the cable connectors 210, 310.

Returning to FIG. 2, the cable rack assembly 200 may include the rack sub-assembly 360 and a rack sub-assembly 370. The rack sub-assembly 370 may be constructed in a similar manner as the rack sub-assembly 360 and may be joined to the rack sub-assembly 360. For example, the coupling post 350 may extend entirely through each of the rack sub-assemblies 360, 370. The coupling post 350 may secure to the outer support panels 311, 315. As such, the support panels 311-315 may be coupled directly or indirectly to one another and held in substantially fixed positions with respect to one another. The cable rack assembly 200 may then be inserted into a system chassis, such as the system chassis 102 (FIG. 1) of the communication system 100 (FIG. 1).

Accordingly, the stack 221 of the cable connectors 210 is located between the outer support panel 311 and the shared support panel 312. The cable connectors 210 directly engage both the outer support panel 311 and the shared support panel 312. The stack 222 of the cable connectors 310 is located between the shared support panel 312 and the inner support panel 313A. The cable connectors 310 directly engage both the shared support panel 312 and the outer support panel 311. The stacks 223, 224 may be held by the support frame 304 in a similar manner. When the cable rack assembly 200 is fully constructed, the cable connectors 210, 310 of the two-dimensional array 206 face in a common mating direction $M_1$, and the cable connectors 210, 310 of the two-dimensional array 208 face in a common mating direction $M_2$. The mating directions $M_1$, $M_2$ are in respective opposite directions along the mating axis 291.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The patentable scope should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112(f), unless and until such claim limitations expressly use the phrase "means for" followed by a statement of function void of further structure.

What is claimed is:

1. A cable rack assembly comprising:
   first and second stacks of cable connectors, the cable connectors of the first and second stacks having respective front ends that face in a common mating direction and respective back ends that are coupled to corresponding cables, the first and second stacks being adjacent to each other and forming a two-dimensional array of the cable connectors; and
   a shared support panel positioned between the first and second stacks of the cable connectors, the shared support panel coinciding with a panel plane that extends transverse to the two-dimensional array, the cable connectors of the first and second stacks directly engaging the shared support panel therebetween.

2. The cable rack assembly of claim 1, wherein the shared support panel has inner edges that define a plurality of panel openings, the cable connectors including lateral projections that extend into the panel openings, the inner edges engaging the lateral projections to restrain the corresponding cable connectors from moving along the shared support panel.

3. The cable rack assembly of claim 2, wherein the first stack includes a first cable connector and the second stack includes a second cable connector, the first and second cable connectors being adjacent to each other with the shared support panel therebetween, wherein the lateral projections of the first and second cable connectors extend into a common panel opening of the plurality of panel openings.

4. The cable rack assembly of claim 2, wherein the first stack includes a first cable connector and the second stack includes a second cable connector, the first and second cable connectors being adjacent to each other with the shared support panel therebetween, each of the first and second cable connectors having two of the lateral projections that engage the inner edges, the two lateral projections being located different distances with respect to the front end of the corresponding cable connector.

5. The cable rack assembly of claim 1, wherein the two-dimensional array of the cable connectors defines a mating interface that is presented to an exterior of the cable rack assembly, the shared support panel having a front edge that is covered by the cable connectors of the first and second stacks.

6. The cable rack assembly of claim 1, wherein each of the cable connectors has a connector side that extends between the respective front and back ends and faces the connector side of an adjacent cable connector, the connector sides including platform portions that are proximate to the respective front end and recessed portions that are proximate to the respective back end, wherein the platform portions of the adjacent cable connectors abut one another and the recessed portions form a panel-receiving slot therebetween, the shared support panel being disposed within the panel-receiving slot.

7. The cable rack assembly of claim 1, further comprising first and second support panels, the first stack of the cable connectors being located between the first support panel and the shared support panel, the second stack of the cable connectors being located between the second support panel and the shared support panel, the cable connectors of the first and second stacks directly engaging the first and second support panels, respectively.

8. The cable rack assembly of claim 7, wherein an elongated coupling post extends between and couples the first and second support panels.

9. The cable rack assembly of claim 1, wherein each of the cable connectors includes a high-density contact array of signal contacts.

10. The cable rack assembly of claim 1, wherein the two-dimensional array is a first two-dimensional array and the cable rack assembly includes a second two-dimensional array, the first and second two-dimensional arrays facing in respective opposite directions and being interconnected by the cables.

11. A communication system comprising:
a system chassis having a chassis cavity;
a two-dimensional array of cable connectors disposed within the chassis cavity, the cable connectors of the two-dimensional array having respective front ends that face in a common mating direction and respective back ends that are coupled to corresponding cables, the two-dimensional array including a plurality of stacks in which each of the stacks includes a series of the cable connectors arranged side-by-side; and
a system frame holding the two-dimensional array of the cable connectors with respect to the system chassis, the system frame including a shared support panel that coincides with a panel plane and extends transverse to the two-dimensional array, the shared support panel extending between two of the stacks and being directly engaged by the cable connectors of the two stacks.

12. The communication system of claim 11, wherein the shared support panel has inner edges that define a plurality of panel openings, the cable connectors of the two stacks including lateral projections that extend into the panel openings, the inner edges engaging the lateral projections to restrain the corresponding cable connectors from moving along the shared support panel.

13. The communication system of claim 12, wherein the two stacks include a first stack of the cable connectors and a second stack of the cable connectors, the first and second stacks having first and second cable connectors, respectively, that are adjacent to each other with the shared support panel therebetween, wherein the lateral projections of the first and second cable connectors extend into a common panel opening of the plurality of panel openings.

14. The communication system of claim 12, wherein the two stacks include a first stack of the cable connectors and a second stack of the cable connectors, the first and second stacks having first and second cable connectors, respectively, that are adjacent to each other with the shared support panel therebetween, each of the first and second cable connectors having two of the lateral projections that engage the inner edges, the two lateral projections being located different distances with respect to the front end of the corresponding cable connector.

15. The communication system of claim 11, wherein the two-dimensional array of the cable connectors defines a mating interface that is presented to an exterior of the communication system, the shared support panel having a front edge that is covered by the cable connectors of the two stacks.

16. The communication system of claim 11, wherein each of the cable connectors of the two stacks has a connector side that extends between the respective front and back ends and faces the connector side of an adjacent cable connector, the connector sides including platform portions that are proximate to the respective front end and recessed portions that are proximate to the respective back end, wherein the platform portions of the adjacent cable connectors abut one another and the recessed portions form a panel-receiving slot therebetween, the shared support panel being disposed within the panel-receiving slot.

17. The communication system of claim 11, wherein the communication system is one of a cable backplane system or a cable midplane system.

18. The communication system of claim 11, wherein the system frame further comprises first and second support panels and an elongated coupling post, the shared support panel being positioned between the first and second support panels, the coupling post extending through the shared support panel and coupling to each of the first and second support panels.

19. The communication system of claim 11, wherein each of the cable connectors includes a high-density contact array of signal contacts.

20. The communication system of claim 11, wherein the two-dimensional array includes more than twenty cable connectors.

* * * * *